(12) United States Patent
Sun

(10) Patent No.: US 11,083,106 B2
(45) Date of Patent: Aug. 3, 2021

(54) HEAT SINK AND FREQUENCY CONVERTER

(71) Applicant: Siemens Aktiengesellschaft, Munich (DE)

(72) Inventor: Yao Sun, nanjing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/605,547

(22) PCT Filed: Apr. 17, 2018

(86) PCT No.: PCT/EP2018/059768
§ 371 (c)(1),
(2) Date: Oct. 16, 2019

(87) PCT Pub. No.: WO2018/192919
PCT Pub. Date: Oct. 25, 2018

(65) Prior Publication Data
US 2020/0128696 A1 Apr. 23, 2020

(30) Foreign Application Priority Data

Apr. 19, 2017 (CN) .......................... 201720418240.2

(51) Int. Cl.
*H05K 7/20* (2006.01)
*F28D 15/02* (2006.01)
*F28F 1/14* (2006.01)

(52) U.S. Cl.
CPC ..... *H05K 7/20409* (2013.01); *F28D 15/0275* (2013.01); *F28F 1/14* (2013.01); *H05K 7/20172* (2013.01)

(58) Field of Classification Search
CPC ............ H05K 7/20409; H05K 7/20172; F28D 15/0275; F28F 1/14

(Continued)

(56) References Cited

U.S. PATENT DOCUMENTS 6,394,175 B1 * 5/2002 Chen ...................... H01L 23/467
165/80.3
6,626,233 B1 * 9/2003 Connors ............. F28D 15/0233
165/104.33

(Continued)

FOREIGN PATENT DOCUMENTS

DE 102014012349 A1 3/2015
EP 2315340 A1 4/2011
WO WO 2012098780 A1 7/2012

OTHER PUBLICATIONS

International Search Report PCT/ISA/210 for International Application No. PCT/EP2018/059768 filed Apr. 17, 2018.

(Continued)

*Primary Examiner* — Anatoly Vortman
(74) *Attorney, Agent, or Firm* — Harness, Dickey & Pierce, P.L.C.

(57) ABSTRACT

The present application provides a heat sink, including: a heat dissipation plate and at least one heat dissipation tube, the heat dissipation tube further including a first tube section. The bent part and a second tube section, with the first tube section of the heat dissipation tube is at least partially embedded in the heat dissipation plate and the second tube section is arranged outside the heat dissipation plate. The first tube section and the second tube section are parallel to each other and connected via the bent part. The heat dissipation tube is provided with at least one cooling fin extending outwards from an outer wall of the heat dissipation tube. In addition, a frequency converter employs the heat sink in an embodiment. The heat sink of at least one embodiment has high heat dissipation efficiency and a small volume.

11 Claims, 4 Drawing Sheets

(58) Field of Classification Search
USPC .......................................................... 361/697
See application file for complete search history.

(56) References Cited

U.S. PATENT DOCUMENTS

| | | | | |
|---|---|---|---|---|
| 6,639,799 B2 * | 10/2003 | Prasher | ................. | H01L 23/427 |
| | | | | 165/80.4 |
| 6,937,474 B2 * | 8/2005 | Lee | ...................... | H01L 23/427 |
| | | | | 165/104.21 |
| 6,968,890 B1 * | 11/2005 | Ghantiwala | ......... | F28D 15/0275 |
| | | | | 165/104.21 |
| 7,000,687 B2 * | 2/2006 | Ying | ................... | F28D 15/0233 |
| | | | | 165/104.21 |
| 7,013,955 B2 * | 3/2006 | Phillips | ................. | F28D 15/025 |
| | | | | 165/104.21 |
| 7,231,961 B2 * | 6/2007 | Alex | ................... | F28D 15/0266 |
| | | | | 165/104.33 |
| 7,245,494 B2 * | 7/2007 | Cheng | ....................... | G06F 1/20 |
| | | | | 165/104.26 |
| 7,394,656 B1 * | 7/2008 | Huang | ................ | H01L 23/4006 |
| | | | | 165/104.33 |
| 7,477,515 B2 * | 1/2009 | Tsai | ...................... | H01L 23/427 |
| | | | | 257/E23.088 |
| 7,495,915 B2 * | 2/2009 | Chen | .................... | H01L 23/427 |
| | | | | 165/104.33 |
| 7,511,947 B2 * | 3/2009 | Leng | ...................... | H01L 23/427 |
| | | | | 165/104.21 |
| 7,755,897 B2 * | 7/2010 | Chen | .................... | H01L 23/427 |
| | | | | 361/707 |
| 7,944,688 B2 * | 5/2011 | Cheng | ....................... | G06F 1/20 |
| | | | | 361/679.47 |
| 8,072,763 B2 * | 12/2011 | Li | ....................... | H01L 23/4006 |
| | | | | 361/719 |
| 8,191,612 B2 * | 6/2012 | Huang | ................ | F28D 15/0275 |
| | | | | 165/80.3 |
| 8,262,263 B2 * | 9/2012 | Dinh | ....................... | F21V 29/76 |
| | | | | 362/373 |
| 8,274,300 B2 * | 9/2012 | Sakaue | .............. | G05D 23/1904 |
| | | | | 324/750.03 |
| 8,322,404 B2 * | 12/2012 | Lian | ................... | F28D 15/0233 |
| | | | | 165/80.3 |
| 8,422,218 B2 * | 4/2013 | Fried | ....................... | F28D 15/04 |
| | | | | 361/679.47 |
| 8,755,186 B2 * | 6/2014 | Kitajima | ................... | F28F 1/32 |
| | | | | 361/700 |
| 8,804,336 B2 * | 8/2014 | Lee | ..................... | F28D 15/0275 |
| | | | | 361/700 |
| 8,960,267 B2 * | 2/2015 | Huang | ................ | H01L 23/3672 |
| | | | | 165/80.3 |
| 9,797,660 B2 * | 10/2017 | Huang | ................ | F28D 15/0275 |
| 9,835,384 B2 * | 12/2017 | Anderl | .................... | F28D 15/06 |
| 9,980,410 B1 * | 5/2018 | Wei | ........................ | H01L 23/427 |
| 2001/0030039 A1 * | 10/2001 | Copeland | ........... | H01L 23/3736 |
| | | | | 165/104.26 |
| 2002/0036889 A1 | 3/2002 | Razi | | |
| 2004/0108100 A1 * | 6/2004 | Horng | ................... | H01L 23/467 |
| | | | | 165/80.3 |
| 2005/0145369 A1 * | 7/2005 | Huang | ................ | F28D 15/0275 |
| | | | | 165/104.11 |
| 2005/0178532 A1 * | 8/2005 | Meng-Cheng | ...... | F28D 15/0233 |
| | | | | 165/104.33 |
| 2005/0241808 A1 * | 11/2005 | Lee | ...................... | H01L 23/427 |
| | | | | 165/104.33 |
| 2006/0227504 A1 | 10/2006 | Chen et al. | | |
| 2007/0144709 A1 * | 6/2007 | Lee | ...................... | H01L 23/427 |
| | | | | 165/104.33 |
| 2009/0154105 A1 * | 6/2009 | Chu | .................... | F28D 15/0233 |
| | | | | 361/703 |
| 2011/0051370 A1 | 3/2011 | Leutwein | | |
| 2011/0149516 A1 * | 6/2011 | Yang | .................... | H01L 23/427 |
| | | | | 361/697 |
| 2012/0044646 A1 | 2/2012 | Pal | | |
| 2012/0211201 A1 * | 8/2012 | Kunstwadl | .............. | F21S 2/005 |
| | | | | 165/104.21 |
| 2013/0291564 A1 * | 11/2013 | Ghoshal | ................. | F28F 1/325 |
| | | | | 62/3.6 |
| 2014/0041838 A1 * | 2/2014 | Lin | ...................... | H01L 23/427 |
| | | | | 165/104.21 |
| 2014/0138074 A1 * | 5/2014 | Huang | ................ | F28D 15/0275 |
| | | | | 165/185 |
| 2016/0131442 A1 * | 5/2016 | Huang | ................ | F28D 15/0233 |
| | | | | 165/76 |
| 2016/0285295 A1 | 9/2016 | Marinov et al. | | |

OTHER PUBLICATIONS

Written Opinion of the International Search Authority PCT/ISA/237 for International Application No. PCT/EP2018/059768 filed Apr. 17, 2018.

* cited by examiner

HEAT SINK AND FREQUENCY CONVERTER

PRIORITY STATEMENT

This application is the national phase under 35 U.S.C. § 371 of PCT International Application No. PCT/EP2018/059768, which has an International filing date of Apr. 17, 2108, which designated the United States of America, and which claims priority to Chinese Patent Application No. CN 2017204182402 filed Apr. 19, 2017, the entire contents of which are hereby incorporated herein by reference.

FIELD

Embodiments of invention relate a heat sink suitable for a frequency converter and/or a driver, and a frequency converter employing such a heat sink.

BACKGROUND

In the motion control field, for example in large frequency converters and/or driver equipment, heat dissipation is of vital importance. For instance, FIG. 1 shows a conventional heat sink used in a frequency converter, chiefly formed of multiple cooling fins 1 arranged side by side and a fan 2. However, such a heat sink has a low heat dissipation efficiency per unit volume. In order to achieve a heat dissipation effect with a high design requirement, it is necessary to increase the size of the cooling fins 1, but this will increase the space needed to install the cooling fins 1, with the result that the volume of the heat sink as a whole is larger.

SUMMARY

Embodiments of the present application propose a completely new heat sink, which improves heat dissipation efficiency and has a more compact structure. Thus, the heat sink of embodiments of the present application is, on the whole, superior to a conventional heat sink product.

Specifically, at least one embodiment of the present application provide a heat sink, comprising: a heat dissipation plate and at least one heat dissipation tube, the heat dissipation tube further comprising a first tube section, a bent part and a second tube section, with the first tube section of the heat dissipation tube being at least partially embedded in the heat dissipation plate, the second tube section being arranged outside the heat dissipation plate, and the first tube section and the second tube section being parallel to each other and connected via the bent part, wherein the heat dissipation tube is provided with at least one cooling fin extending outwards from an outer wall of the heat dissipation tube. With this structure, the entire heat dissipation tube is in full contact with the heat dissipation plate, to enhance heat conduction.

According to another embodiment of the present application, a frequency converter is also provided, comprising a heat sink of at least one embodiment.

BRIEF DESCRIPTION OF THE DRAWINGS

The accompanying drawings are included to provide further understanding of the present application. They are recorded and form part of the present application. The drawings show embodiments of the present application, and together with this description serve to explain the principles of the present application. In the drawings.

Figure 1:
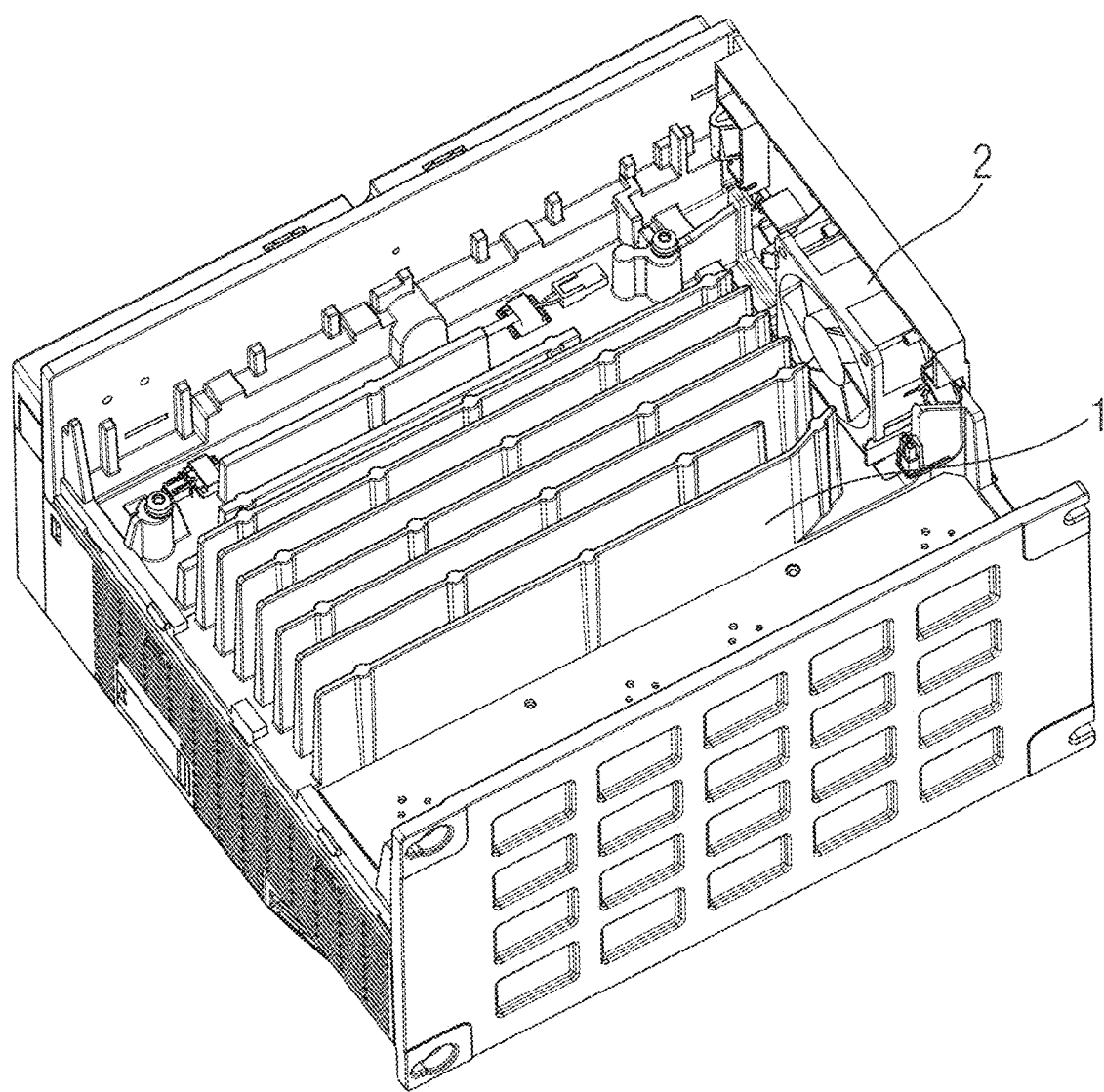
FIG. 1 shows an embodiment of a heat sink in the prior art.

Key to labels used in the drawings:
1 cooling fin
2 fan
10 heat sink
11 heat dissipation plate
12 heat dissipation tube
13 first tube section
14 bent part
15 second tube section
16 cooling fin
17 first outside surface
18 second outside surface
19 heat source
20 opening
21 fan
22 end opening

DETAILED DESCRIPTION OF EXAMPLE EMBODIMENTS

Specifically, at least one embodiment of the present application provide a heat sink, comprising: a heat dissipation plate and at least one heat dissipation tube, the heat dissipation tube further comprising a first tube section, a bent part and a second tube section, with the first tube section of the heat dissipation tube being at least partially embedded in the heat dissipation plate, the second tube section being arranged outside the heat dissipation plate, and the first tube section and the second tube section being parallel to each other and connected via the bent part, wherein the heat dissipation tube is provided with at least one cooling fin extending outwards from an outer wall of the heat dissipation tube. With this structure, the entire heat dissipation tube is in full contact with the heat dissipation plate, to enhance heat conduction.

According to an embodiment of the present application, in the abovementioned heat sink, the heat dissipation tube is provided with multiple cooling fins arranged centrosymmetrically in a radial cross section of the heat dissipation tube, with each of the cooling fins extending in an axial direction of the heat dissipation tube. The cooling fins in this form can significantly increase the surface area of the entire heat sink, increasing the heat dissipation efficiency.

According to an embodiment of the present application, in the abovementioned heat sink, the cooling fin is bent in a spiral manner in a radial cross section of the heat dissipation tube.

According to an embodiment of the present application, in the abovementioned heat sink, the second tube section of the heat dissipation tube is arranged on a first outside surface of the heat dissipation plate, and a second outside surface, opposite the first outside surface, of the heat dissipation plate is a heat source mounting surface adapted to be in contact with a heat source.

According to an embodiment of the present application, in the abovementioned heat sink, the second tube section of the heat dissipation tube is provided with an opening located in a position opposite the heat source mounting surface. The opening can help to form an airflow by means of an air pressure difference, enhancing a heat dissipation effect.

According to an embodiment of the present application, in the abovementioned heat sink, the opening is provided between two adjacent cooling fins. According to an embodiment of the present application, the abovementioned heat sink further comprises: a fan arranged directly opposite the bent part of the heat dissipation tube. According to an embodiment of the present application, in the abovementioned heat sink, an end opening of the first tube section leads to the outside of the heat dissipation plate.

According to an embodiment of the present application, in the abovementioned heat sink, the heat dissipation tube is a copper tube, and the heat dissipation plate is an aluminum plate.

According to another embodiment of the present application, a frequency converter is also provided, comprising a heat sink of at least one embodiment.

It should be understood that both the general description of the present application above and the detailed description thereof below are illustrative and explanatory, and intended to provide further explanation of the present application as described in the claims.

Embodiments of the present application are now described, making detailed reference to the accompanying drawings. Preferred embodiments of the present application are now referred to in detail, examples thereof being shown in the accompanying drawings. In any possible situation, identical labels are used in all drawings to indicate identical or similar parts. In addition, although terms used in the present application are selected from well-known and widely used terms, some terms mentioned in the description of the present application might be selected by the applicant according to his or her judgement, and the detailed meanings thereof are explained in the relevant parts of the descriptions herein. In addition, it is required that the present application shall be understood not just through the actual terms used, but also through the meaning implied in each term.

Figure 2:
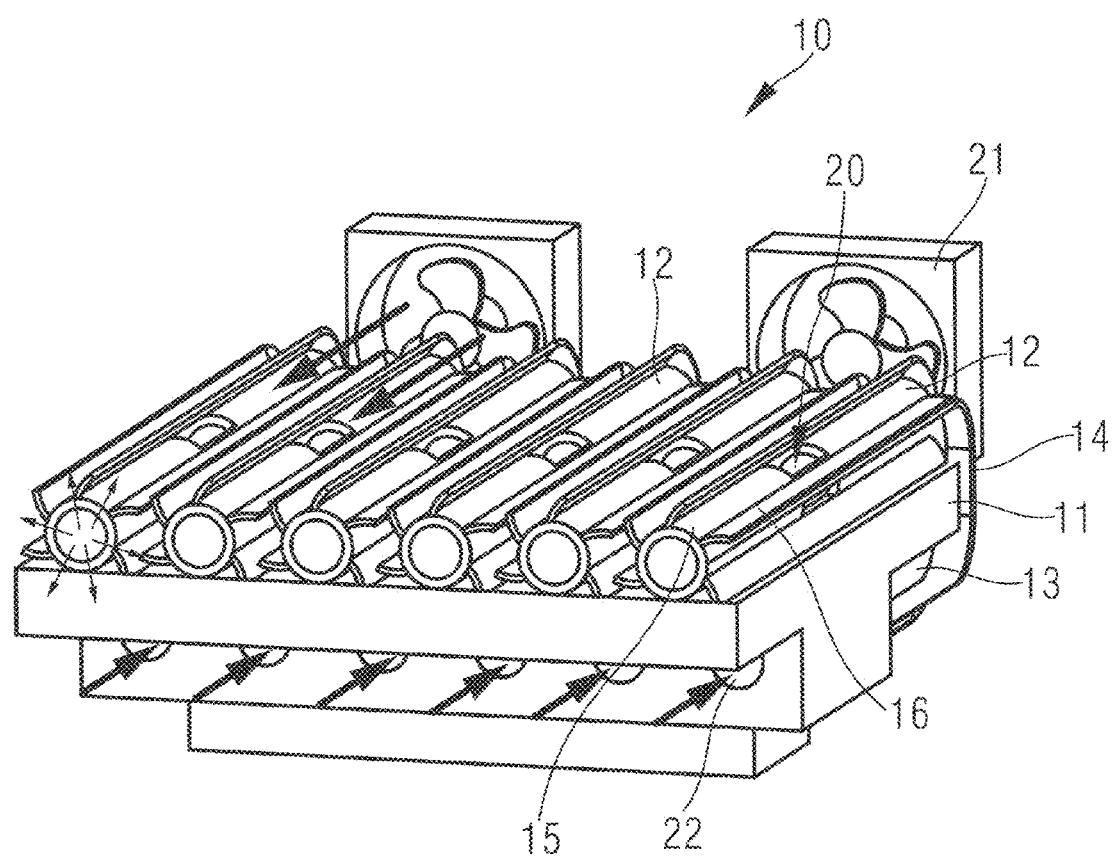
FIG. 2 shows an embodiment of a heat sink according to the present application.

Reference is made to the accompanying drawings to discuss in greater detail the basic principles and preferred embodiments of the present application. As FIG. 2 shows, a heat sink 10 of the present application mainly comprises: a heat dissipation plate 11 and at least one heat dissipation tube 12. The heat dissipation tube 12 further comprises a first tube section 13, a bent part 14 and a second tube section 15. The first tube section 13 of the heat dissipation tube 11 is at least partially embedded in the heat dissipation plate 11. The second tube section 15 is arranged outside the heat dissipation plate 11. The first tube section 13 and the second tube section 15 are parallel to each other and connected via the bent part 14. In particular, the heat dissipation tube 12 is provided with at least one cooling fin 16 extending outwards from an outer wall of the heat dissipation tube 12. Preferably, the heat dissipation tube 12 may be a copper tube; at the same time, the heat dissipation plate 11 may be an aluminum plate. With this structure, the entire heat dissipation tube 12 is in full contact with the heat dissipation plate 11, to enhance heat conduction. In addition, the cooling fin 16 can significantly increase the surface area of the entire heat sink 10, increasing the heat dissipation efficiency.

In the embodiment shown in FIG. 2, the heat dissipation tube 12 may be provided with multiple cooling fins 16 arranged centrosymmetrically in a radial cross section of the heat dissipation tube 12. Each of these cooling fins 16 extends in an axial direction of the heat dissipation tube 12. In addition, the cooling fin 16 may also be bent in a spiral manner in a radial cross section of the heat dissipation tube 12, thereby obtaining a larger surface area within a smaller space.

Figure 3:
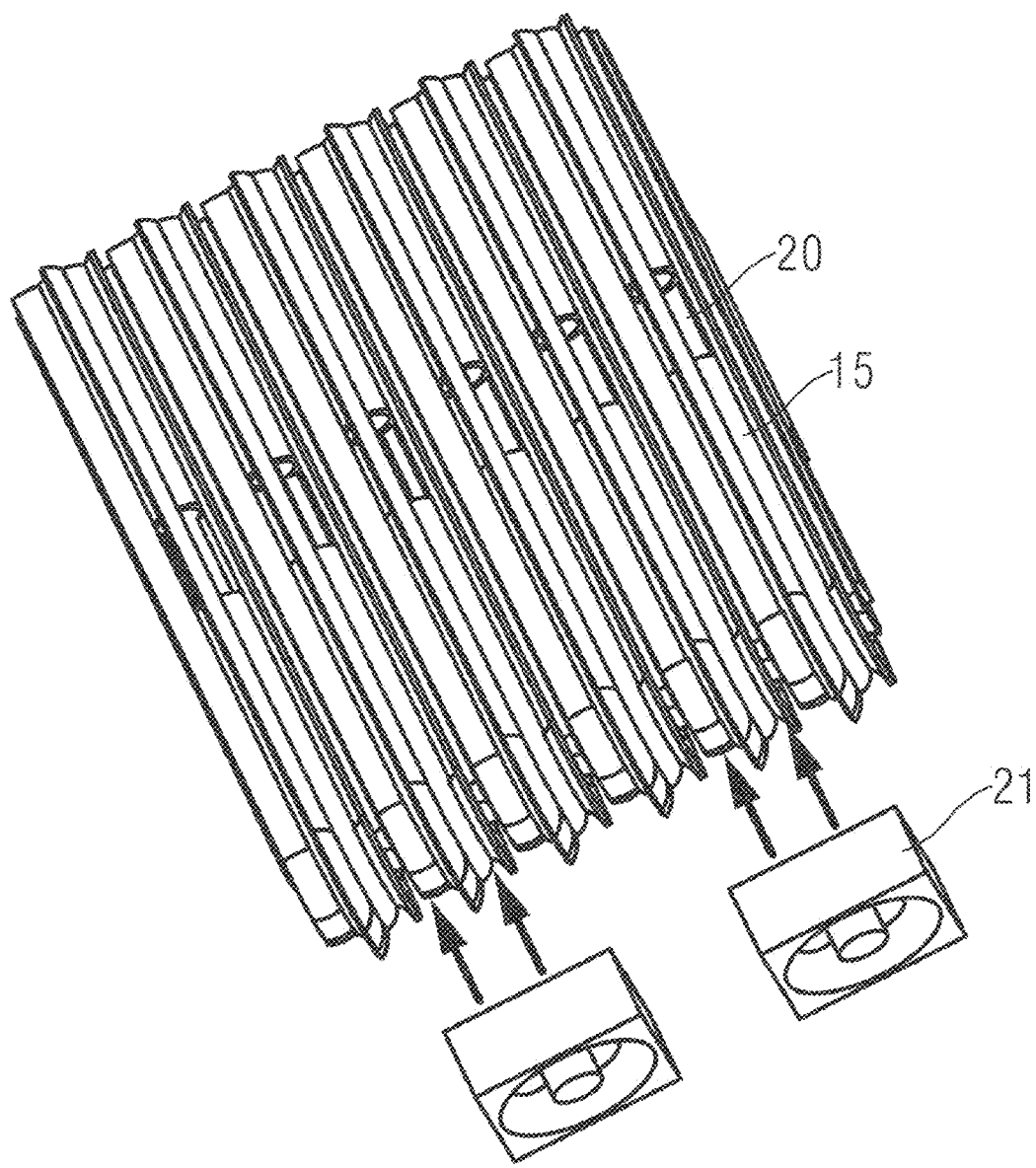
FIG. 3 shows the airflow direction during operation of the heat sink shown in FIG. 2.
Figure 4:
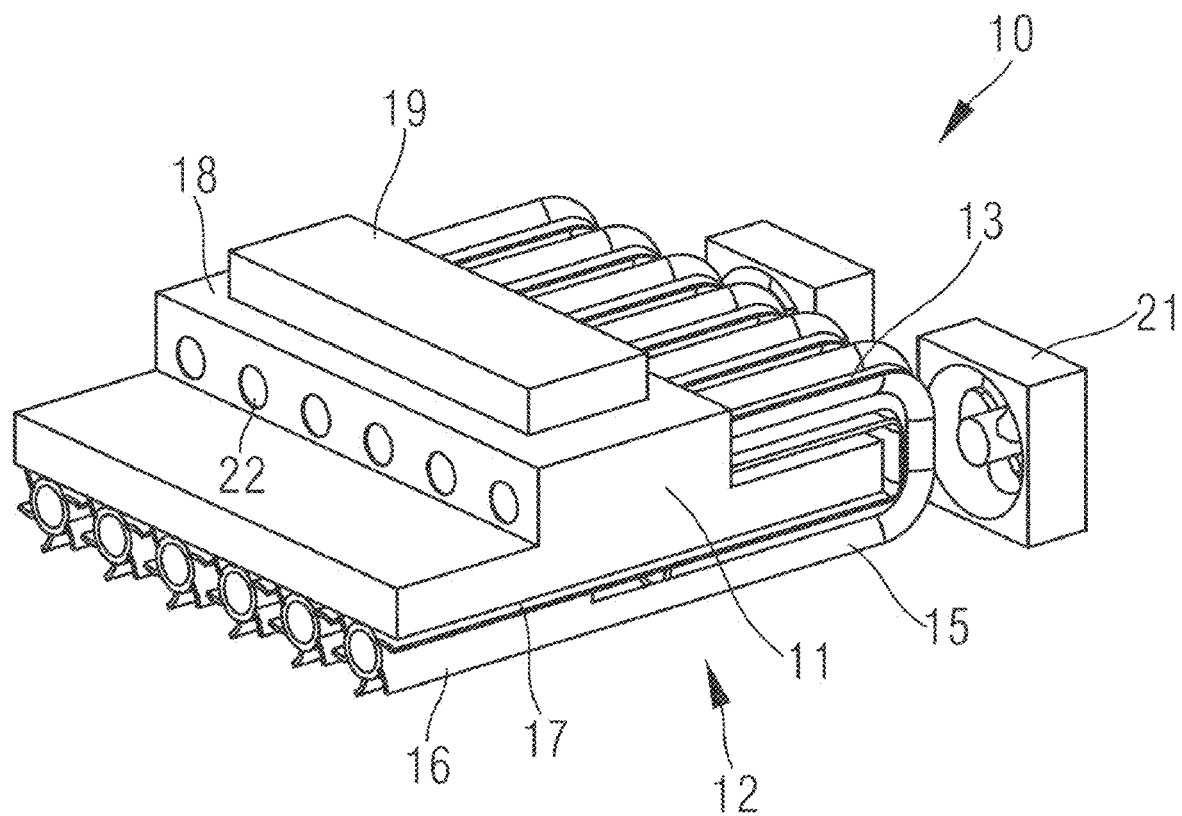
FIG. 4 shows the bottom structure of the heat sink shown in FIG. 2.

Turning to FIG. 4, the second tube section 15 of the heat dissipation tube 12 is arranged on a first outside surface 17 of the heat dissipation plate 11, and a second outside surface 18, opposite the first outside surface 17, of the heat dissipation plate 11 is a heat source mounting surface adapted to be in contact with a heat source 19. As shown in FIGS. 2-4, for example, the heat dissipation plate 11 may have a T-shaped structure, the heat dissipation tube 12 may have a U-shaped structure, and these two components are arranged to be in contact with each other as fully as possible, to increase the heat dissipation efficiency.

In addition, the second tube section 15 of the heat dissipation tube 12 may be provided with an opening 20, refer to FIG. 2. The opening 20 may be located in a position opposite the heat source mounting surface (second outside surface 18), and may be provided between two adjacent cooling fins 16. Moreover, the heat sink 10 may further comprise a fan 21 arranged directly opposite the bent part 14 of the heat dissipation tube 12.

Thus, as shown in FIG. 3, when the fan 21 is operating, an airflow on a surface of the second tube section 15 of the heat dissipation tube 12 forms an inside/outside air pressure offset of the second tube section 15, in turn causing air in the second tube section 15 to be discharged outwards from the opening 20 (an airflow direction being as shown in FIG. 3), and then causing an end opening 22 of the first tube section 13 to suck in external air (an airflow direction being as shown in FIG. 2), wherein the end opening 22 of the first tube section 13 leads to the outside of the heat dissipation plate 11 (as shown in FIGS. 2 and 4).

In summary, the present application proposes a heat sink, and a frequency converter using such a heat sink. The heat sink employs a structure with a completely new design, to obtain higher heat dissipation efficiency in as small a space as possible, has better overall performance than a conventional heat sink product, and is especially suitable for a frequency converter product with a compact structure.

It will be obvious to those skilled in the art that various amendments and changes in form could be made to the abovementioned demonstrative embodiments of the present application, without deviating from the spirit and scope of the present application. Thus, the present application is intended to cover amendments and changes in form to the present application which fall within the scope of the attached claims and equivalent technical solutions thereof.

The invention claimed is:
1. A heat sink, comprising:
a heat dissipation plate; and
at least one heat dissipation tube, the at least one heat dissipation tube further including a first tube section, a bent part and a second tube section, the first tube section of the at least one heat dissipation tube being at least partially embedded in the heat dissipation plate, the second tube section being arranged outside the heat dissipation plate, and the first tube section and the second tube section being parallel to each other and being connected via the bent part, wherein the at least one heat dissipation tube is provided with at least one cooling fin extending outwards from an outer wall of the at least one heat dissipation tube,
wherein the at least one heat dissipation tube includes multiple cooling fins, arranged centrosymmetrically in a radial cross section of the at least one heat dissipation tube, each of the multiple cooling fins extending in an axial direction of the at least one heat dissipation tube, and wherein the multiple cooling fins are bent in a spiral manner in a radial cross section of the at least one heat dissipation tube.

2. The heat sink of claim 1, wherein the second tube section of the at least one heat dissipation tube is arranged on a first outside surface of the heat dissipation plate, and a second outside surface, opposite the first outside surface, of the heat dissipation plate is a heat source mounting surface adapted to be in contact with a heat source.

3. The heat sink of claim 2, wherein the second tube section of the at least one heat dissipation tube is provided with an opening located in a position opposite the heat source mounting surface.

4. The heat sink of claim 2, wherein the second tube section of the at least one heat dissipation tube is provided with an opening, the opening being provided between two adjacent cooling fins of the at least one heat dissipation tube.

5. The heat sink of claim 1, further comprising:
a fan, arranged directly opposite the bent part of the at least one heat dissipation tube.

6. The heat sink of claim 1, wherein an end opening of the first tube section leads to an outside of the heat dissipation plate.

7. The heat sink of claim 1, wherein the at least one heat dissipation tube is a copper tube, and the heat dissipation plate is an aluminum plate.

8. A frequency converter, comprising the heat sink of claim 1.

9. A frequency converter, comprising the heat sink of claim 2.

10. A frequency converter, comprising the heat sink of claim 3.

11. A frequency converter, comprising the heat sink of claim 4.

* * * * *